United States Patent
Ralston-Good et al.

(10) Patent No.: US 7,239,163 B1
(45) Date of Patent: Jul. 3, 2007

(54) DIE-LEVEL PROCESS MONITOR AND METHOD

(75) Inventors: Jeremy John Ralston-Good, Tucson, AZ (US); Philipp S. Spuhler, Tucson, AZ (US); Bert M. Vermeire, Phoenix, AZ (US); Douglas Leonard Goodman, Tucson, AZ (US)

(73) Assignee: Ridgetop Group, Inc., Tucson, AZ (US)

( * ) Notice: Subject to any disclaimer, the term of this patent is extended or adjusted under 35 U.S.C. 154(b) by 0 days.

(21) Appl. No.: 11/156,022

(22) Filed: Jun. 17, 2005

Related U.S. Application Data

(60) Provisional application No. 60/581,811, filed on Jun. 23, 2004.

(51) Int. Cl.
G01R 31/02 (2006.01)
(52) U.S. Cl. .................. 324/763; 324/765; 438/18; 257/48
(58) Field of Classification Search ............... 324/763, 324/765, 158.1; 438/15–18; 257/48; 716/4, 716/116; 714/733–734
See application file for complete search history.

(56) References Cited

U.S. PATENT DOCUMENTS

| | | | | |
|---|---|---|---|---|
| 4,243,937 A | * | 1/1981 | Multani et al. | 324/765 |
| 4,413,271 A | * | 11/1983 | Gontowski et al. | 257/48 |
| 5,039,602 A | * | 8/1991 | Merrill et al. | 438/11 |
| 5,068,547 A | * | 11/1991 | Gascoyne | 326/16 |
| 5,631,596 A | * | 5/1997 | Sporck et al. | 327/378 |
| 5,838,163 A | * | 11/1998 | Rostoker et al. | 324/763 |
| 5,903,012 A | * | 5/1999 | Boerstler | 257/48 |
| 5,929,650 A | * | 7/1999 | Pappert et al. | 324/763 |
| 6,124,143 A | * | 9/2000 | Sugasawara | 438/18 |
| 6,239,603 B1 | * | 5/2001 | Ukei et al. | 324/763 |
| 6,476,414 B1 | * | 11/2002 | Sekine | 257/48 |
| 6,544,807 B1 | * | 4/2003 | Bach | 438/18 |
| 6,759,863 B2 | * | 7/2004 | Moore | 324/765 |
| 6,836,133 B2 | * | 12/2004 | Kinoshita | 324/765 |
| 6,876,218 B1 | * | 4/2005 | Simmons et al. | 324/763 |
| 6,891,389 B1 | * | 5/2005 | Walker et al. | 324/763 |

OTHER PUBLICATIONS

Kazuo Terada et al., A Test Circuit for Measuring MOSFET Threshold Voltage Mismatch, IEEE, 2003, ICMTS 03-227-ICMTS 03-231.

J.A. Croon et al., A comparison of extraction techniques for threshold voltage mismatch, Proc. IEEE 2002 Int. Conference on Microelectronic Test Structures, Apr. 2002, vol. 15, pp. 235-240.

T. Himeno et al., A New Technique for Measuring Threshold Voltage Distribution in Flash EEPROM Devices, Proc. IEEE 1995 Int. Conference on Microelectronic Test Structures, Mar. 1995, vol. 8, pp. 283-287.

* cited by examiner

*Primary Examiner*—Ha Tran Nguyen
*Assistant Examiner*—Arleen M. Vazquez
(74) *Attorney, Agent, or Firm*—Eric A. Gifford

(57) ABSTRACT

A die-level process monitor (DLPM) provides a means for independently determining whether an IC malfunction is a result of the design or the manufacturing processing and further for gathering data on specific process parameters. The DLPM senses parameter variations that result from manufacturing process drift and outputs a measure of the process parameter. The DLPM will typically sense the mismatch of process parameters between two or more test devices as a measure of process variation between a like pair of production devices. The DLPM may be used as a diagnostic tool to determine why an IC failed to perform within specification or to gather statistics on measured process parameters for a given foundry or process.

29 Claims, 8 Drawing Sheets

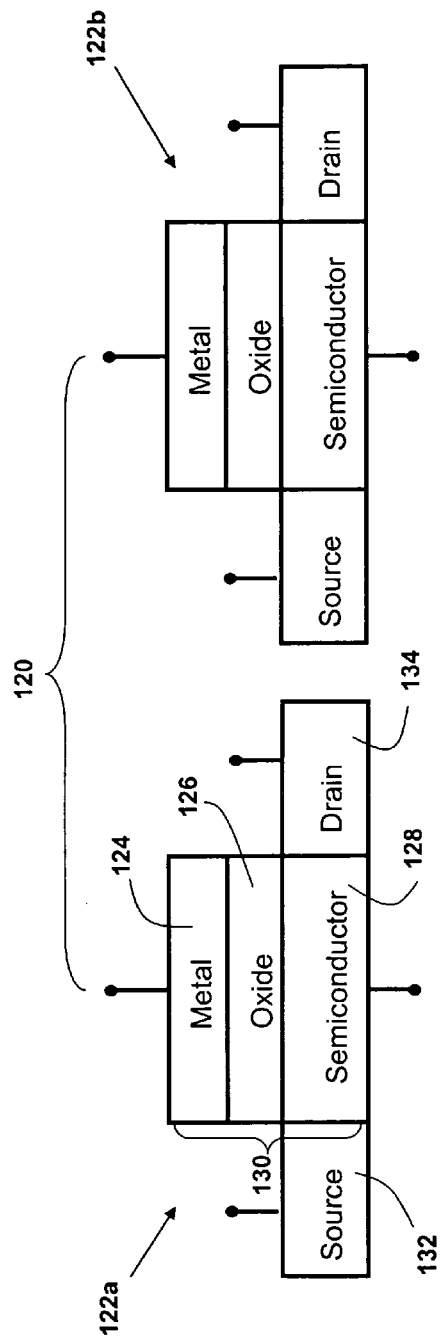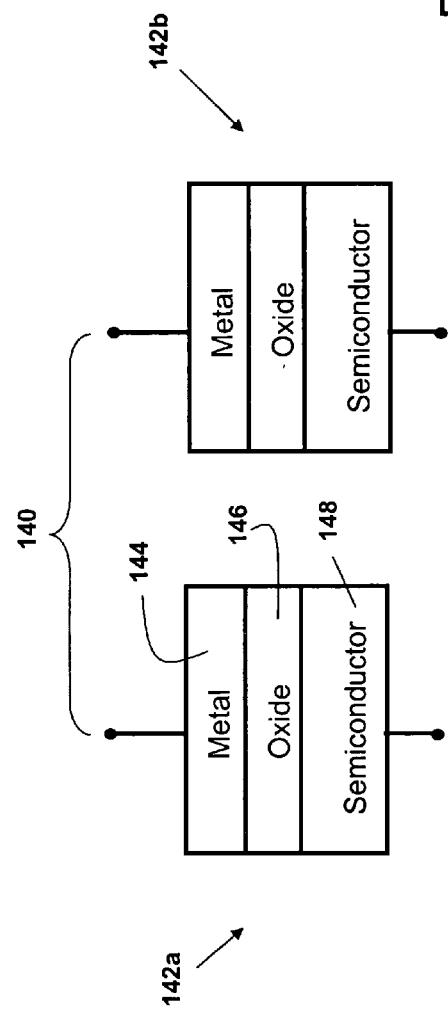
Fig. 6a
Fig. 6b

DIE-LEVEL PROCESS MONITOR AND METHOD

CROSS-REFERENCE TO RELATED APPLICATIONS

This application claims benefit of priority under 35 U.S.C. 119(e) to U.S. Provisional Application No. 60/581,811 entitled "Die-Level IC Process Monitor Method and Apparatus" filed on Jun. 23, 2004, the entire contents of which are incorporated by reference.

BACKGROUND OF THE INVENTION

1. Field of the Invention

This invention relates to process monitors for semiconductor fabrication and more specifically to a die-level process monitor (DLPM).

2. Description of the Related Art

Variations of device parameters such as transistor threshold voltage, resistance, capacitance, inductance, transconductance, and output conductance are certain to occur due to the complexity of semiconductor processing, involving energy, temperature, pressure and concentration gradients as well as geometrical and cleanliness requirements. In spite of strictly governed foundries, semiconductor processing inevitably yields a distribution of parameter values. Resulting parameter variations will affect the performance and functionality of an integrated circuit (IC). For example, typical IC designs require neighboring transistors to be virtually identical to operate properly. A slight difference in parameters in both active and passive devices reflects as an undesired output that may have critical consequences. Process monitoring is currently performed at the wafer level to verify that semiconductor processing-related parameters are within specified design limits.

Fabless companies are by definition circuit design companies that outsource the semiconductor processing to a separate manufacturing company (foundry). A foundry supplies the fabless companies with a process design kit (PDK) containing parameter values relative to their process. Fabless companies design circuits with the acceptance that the supplied PDK describes the process parameters and relative fluctuations accurately.

As illustrated in FIG. 1, the fabless company sends a design file 10, which is the circuit layout 12 of an IC 13, on a disk or via the internet to the foundry. The foundry incorporates the circuit layout to create a 'photoshot' 14. The photoshot 14 commonly consists of the fabless company's IC 13 as well as the foundry's own 'test structures' 16. The test structure 16 is placed down one side of the rectangular photoshot area. The photoshot 14 is placed repeatedly on a large round wafer 18. The test structures 16 are placed in the area of the wafer that will be consumed during the dicing process, known as the 'scribe lines' 20. The wafers are diced along the scribe lines into 'die' 22. The test structures 16 are destroyed and not a part of the final die 22.

The foundry's test structure designs consume large areas of the silicon wafer, require many area-consuming pads for I/O, require external equipment including a probe station, controllable/programmable voltage supply, current meter, ohm meter, volt meter, etc. to perform I/O, and are destroyed and rendered useless during the dicing process. Conventional test structures require external equipment to ramp the input voltage for a duration of time while measuring out the resultant current over time. The data is fed into a computer to compute the values for each device and the differences between two devices. A foundry may designate an entire wafer or specific die sites for testing and not destroy the test structures, however, these die cannot be shipped out as product to customers and are devoted for test only. Furthermore, the composition of the test structures is only known to the foundry's process engineers and thus useless to the fabless company.

It is common for the parameter fluctuations inherent to processing to cause the die not to function as designed. A customer that is supplied only with the die, does not have a means of independently determining whether the malfunction is a result of the customer's design or the foundry's manufacturing process nor can the customer gather data that may be useful for redesigning the chip, providing feedback to the manufacturer, or designing new chips.

SUMMARY OF THE INVENTION

The present invention provides a means for independently determining whether an IC malfunction is a result of the design or the manufacturing processing and further for gathering data on specific process parameters.

This is accomplished by incorporating a process monitor on the IC die that survives the dicing process. The die-level process monitor (DLPM) senses parameter variations that result from manufacturing process drift and outputs a measure of the process parameter. The DLPM will typically sense the mismatch of process parameters between two or more test devices as a measure of process variation between a like pair of production devices in the IC. The DLPM may be used as a diagnostic tool to determine why an IC failed to perform within specification or to gather statistics on measured process parameters for a given foundry or process.

In an exemplary embodiment, the DLPM includes pairs of test devices that are identically designed and selected to sense the process parameter of pairs of production devices on the IC. The test devices may replicate the IC device, e.g. transistor-to-transistor with identical designs, or may be a simpler test structure that is identical with a portion of the production device to sense a particular parameter, e.g. a test capacitor for measuring gate oxide properties of a transistor device. The sensed parameters from each pair of test devices are analyzed and a measure output. The analysis circuit may, for example, include a differential amplifier that detects a differential voltage that is generated across the pair of test devices due to the mismatch in process parameters between the two identically designed test devices. The use of identical devices and a differential amplifier removes all sources of error except the process parameter of interest. Additional analysis may also be formed on-chip.

Since the DLPM is preferably added to each die, it is desirable to minimize the DLPM's footprint to keep the size of the package small and the area available for the IC as large as possible. The pads for performing I/O between the DLPM and the outside world typically dominate the size of the package, and thus it is desirable to minimize their use. In an embodiment, any external circuitry required to drive the DLPM is incorporated on the die and power is shared with the IC to eliminate all input pads. In another embodiment, a single input pad is provided to switch the DLPM on/off. This functionality may be incorporated into the IC and the input pad eliminated. Furthermore, all of the output measures may be multiplexed and output serially via a single output pad.

The DLPM may be incorporated into existing or new ICs that are designed and possibly laid out independently from the DLPM. The DLPM must first be provided as a schematic design file and eventually integrated with the IC in an IC/DLPM layout file that is provided to the foundry for wafer fab. The schematic design file includes a symbolic representation of the DLPM in an electronic file format. The layout file includes a plurality of visual layers in an electronic file format that are representative of the steps for fabricating the host IC and the DLPM in layers of semiconductor materials.

These and other features as well as advantages of the invention will be apparent to those skilled in the art from the following detailed description of preferred embodiments, taken together with the accompanying drawings, in which:

BRIEF DESCRIPTION OF THE DRAWINGS

FIGS. 6a and 6b are diagrams of a pair of production transistors and a pair of test capacitors, respectively, used to sense the oxide thickness and/or leakage current for the pair of production transistors;

DETAILED DESCRIPTION OF THE INVENTION

The present invention provides a die-level process monitor (DLPM) to verify whether semiconductor processing-related parameters are within specified design limits and to accumulate statistics thereof. A process monitor small enough to be implemented at the die level is instrumental to determine root causes of circuit malfunctions and reliability issues. The DLPM will aid process and circuit engineers to extract both process parameters (transistor threshold voltage, resistance, capacitance and inductance, transconductance, output conductance) and respective statistical variations. The DLPM may also be used by the IC to adjust bias conditions based on feedback from the DLPM.

Semiconductor die contain an integrated circuit that performs an electronic function. Although thousands of electronic devices compose the IC, a large portion of this quantity is made up of identical devices. These devices are necessarily designed identically to ensure desired circuit performance. Due to the fact that a large numbers of devices are identical, the DLPM is designed to sense mismatch in devices that are identical to those composing the host circuit. The DLPM senses the mismatch in pairs of devices corresponding to the key devices in the host circuit and in the same foundry manufacturing technology, making the DLPM extracted data most useful in determining the quality control of the manufacturing process and the affects on device and circuit performance.

Figure 1:
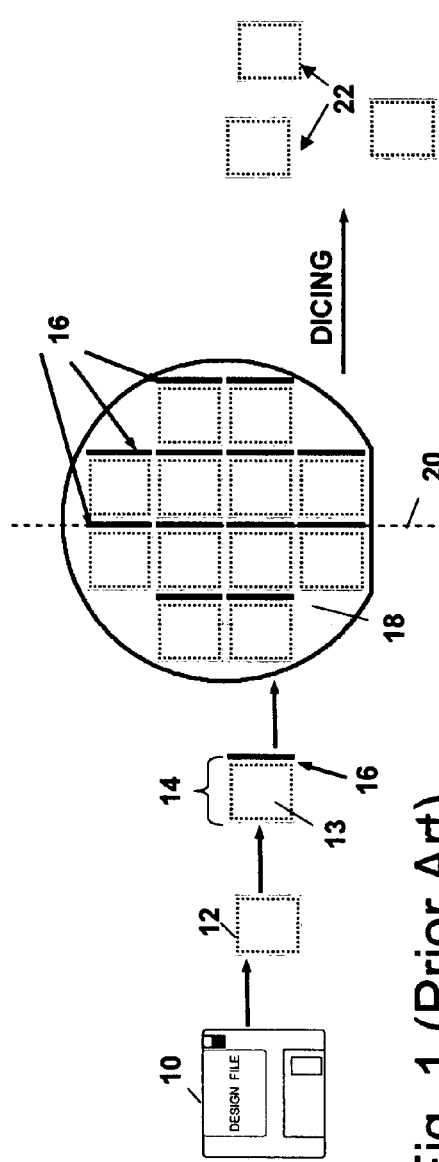
FIG. 1, as described above, illustrates a typical process for IC fabrication and wafer level process monitoring.
Figure 2:
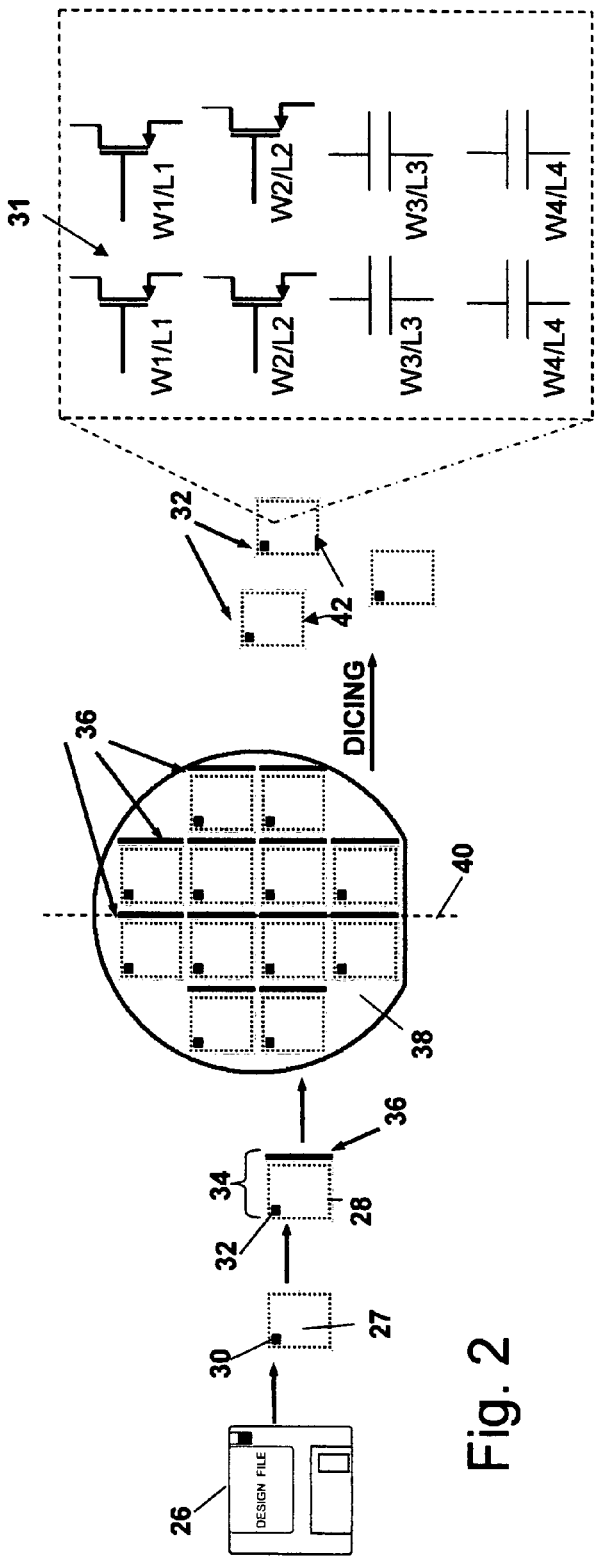
FIG. 2 illustrates a process for IC fabrication incorporating a die-level process monitor (DLPM) in accordance with the present invention.

As shown in FIG. 2, the fabless companies send a design file 26, which is the integration of the circuit layout 27 of an IC 28 including pairs of production devices 31 and the circuit layout 30 of DLPM 32, to the foundry via a disk, internet, etc. The foundry incorporates the circuit layouts to create a 'photoshot' 34 that consists of the fabless company's IC 28 and the DLPM 32 as well as in most cases the foundry's own 'test structures' 36, which are placed down one side of the rectangular photoshot area. The photoshot 34 is placed repeatedly on a large round wafer 38 so that the test structures are placed on the scribe lines 40 of the wafer. The wafers are diced along the scribe lines into 'die' 42. The test structures 36 are destroyed and not a part of the final die but the DLPM 32 remain.

The die 42 are shipped back to the customer and typically put through a quality control process to determine whether the ICs are functioning properly. If a die is "OK", it can be sent out as product. This is very important to fabless companies that purchase relatively small quantities of ICs. Each die is expensive and good die should not be discarded as would occur if the die was a dedicated test structure. If the die fails QC, then the DLPM can be used to sense parameter variations that result from manufacturing process drift and output a measure of the process parameter. The DLPM 32 allows testing to reveal parameter shifts after the dicing step that destroys conventional 'scribe-line' test structures 36.

The DLPM 32 introduces a feedback path supplying process-related parameter variation data to fabless design companies. The DLPM can reveal the cause of IC malfunctions as a result of the circuit design or the circuit processing. As the DLPM is designed to stand alone, it can be added unobtrusively to an existing circuit design prior to fabrication. The die-level process monitor test structures can be utilized before or after the wafers have been packaged and placed in end product.

Figure 3:
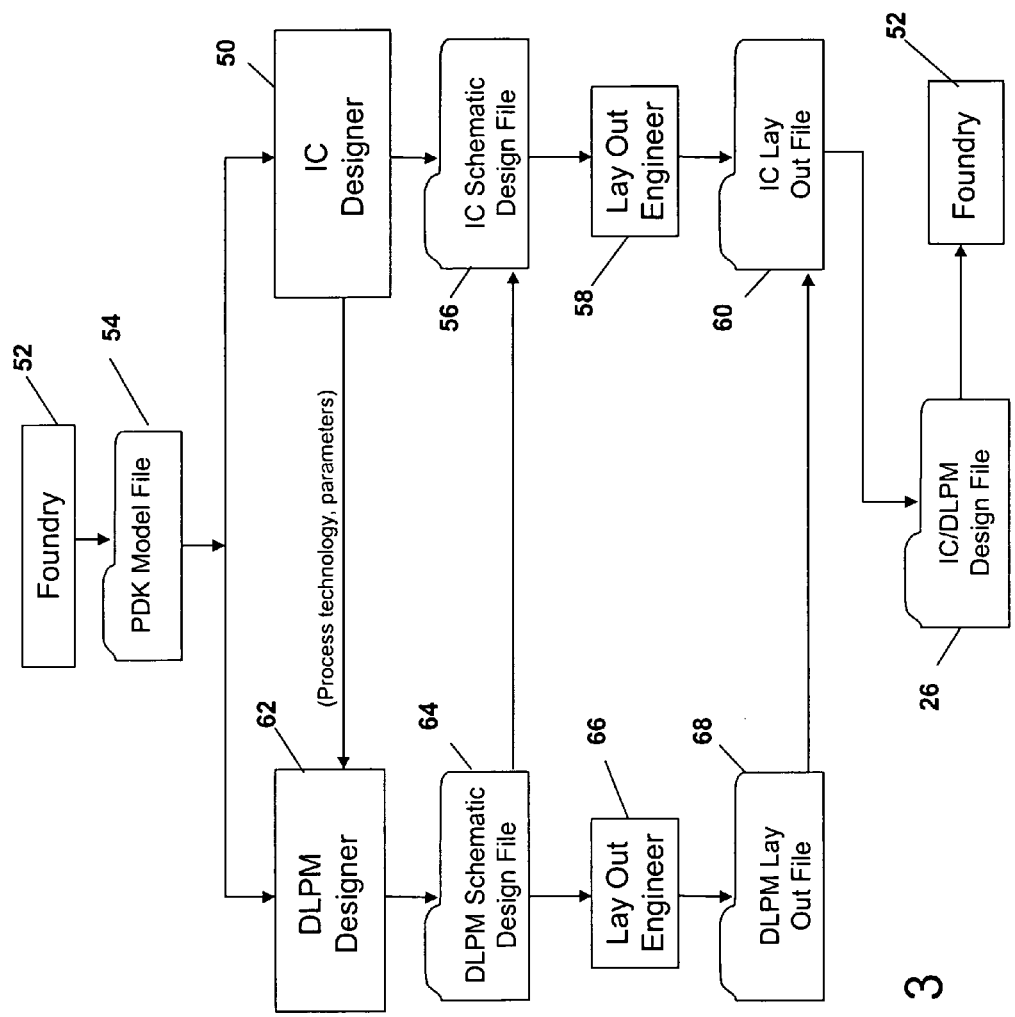
FIG. 3 is a flowchart illustrating a process for creating the DLPM schematic design file and the integrated IC/DLPM layout file for manufacturing the die.

As shown in FIG. 3, the process for creating a typical design file 26 that is provided to the foundry involves a number of different parties including the foundry, IC designer, DLPM designer and layout engineer and produces a number of intermediate files. The design file 26 comprises a plurality of visual layers in an electronic file format, in which the visual layers are representative of the steps for fabricating a host IC and a DLPM in layers of semiconductor materials.

An IC designer 50 designs the IC on a computer as a circuit-level schematic made up of symbols that represent each device. The IC designer decides which process technology and the associated foundry 52 that will manufacture the IC. The foundry is responsible for creating the numerical models associated with each device symbol, to represent to the computer software how the devices operate. These models derived by the foundry are sent to the circuit designers in the form of a Process Design Kit (PDK) file 54. The IC designer uses the PDK file 54 to create and simulate the integrated circuit functionality and expected performance using computer based numerical simulation software. After the IC designer is confident in the IC design, the circuit schematic will be saved as an IC schematic design file 56. The layout engineer(s) 58 will use the IC schematic design file 56 to create an IC Layout file 60 that is representative of how the circuit is fabricated in layers of silicon. This circuit representation is referred to as a 'layout' and saved as design file 26.

The DLPM circuit is created in a similar fashion as a circuit-level schematic, converted to a layout design file and fabricated on the die with the host product circuit. The DLPM design requires the use of the same PDK foundry-specific models 54 used to design the host IC. Therefore communication is required between the host IC Designer and the DLPM Designer 62 stating the target manufacturing process as well as the desired parameters that the DLPM will measure (threshold voltage mismatch, resistance mismatch, capacitance mismatch, etc.). The DLPM designer 62 creates the DLPM schematic design file 64, which comprises a symbolic representation of the DLPM in an electronic file format.

The DLPM can be incorporated into the host IC at schematic file level or the layout file level. In one option, the DLPM schematic design file 64 is merged into the host IC schematic design File 56 and sent to the layout engineer 58 who then creates layout file 60 including both the host IC and DLPM. In a second option, a layout engineer 66 creates a layout file 68 from the DLPM schematic design file 64 and the IC layout file 60 and the DLPM layout file 68 are merged in the layout software. In either case, the integrated layout file 60 is provided as IC/DLPM design file 26 to foundry 52.

In a semiconductor manufacturing environment, fluctuations in device parameters result from the inherent random nature of processing. Deviations of these process-related parameters from their nominal values cause differences in device performances or 'mismatch' between identically designed transistors. Identical electronic components are important for accurate small-signal processing. For example, certain circuits are designed to sense differences in two different voltages or two different currents. These circuits have two separate inputs and one output, the output being the difference of the two inputs in an ideal case. Device mismatch adds inaccuracy to the output and is a dominant factor affecting circuit performance. Mismatch effects are inversely proportional to transistor area and therefore become increasingly important as transistor dimensions and supply voltages are reduced. As technological advancements continue to allow scaling of geometries and power supplies, the problem of mismatch is likely to continue to get worse.

For mismatch characterization, accurate measurements of relative device process parameters are of interest. The DLPM performs simultaneous measurements on two components that form a pair of devices under test, and only the mismatch between the two devices is measured. The matched test device pair mirrors the 'matched' components used in the IC. All other factors that influence parameter measurements are effectively normalized out: both components are identically biased, source and meter variation influences are minimized, temperature drifts are neglected, and EMC (electro magnetic compatibility) disturbances will be almost identical.

Figure 4:
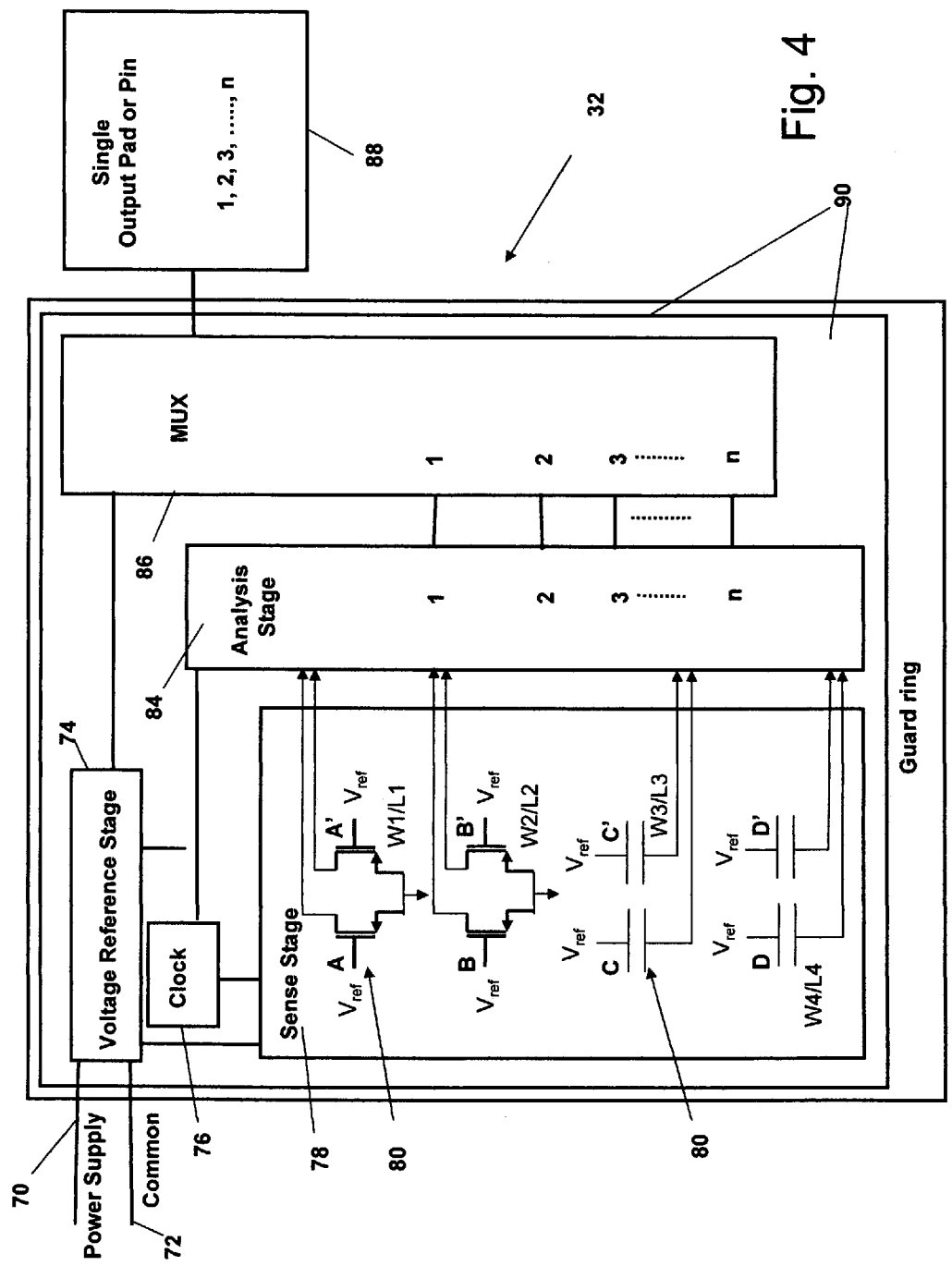
FIG. 4 is a block diagram of the DLPM for sensing the difference in process parameters of pairs of identical test devices designed to mirror different devices in the IC.

An exemplary implementation of a DLPM 32 is shown in FIG. 4. The DLPM is turned on or off by a power supply line 70. This supply line may be connected to an external power supply through a pad or pin, or alternately the power supply line can be connected to the internal power supply bus. In the case that the DLPM is powered by the internal supply bus, the power supply line may be permanently connected resulting in an always on condition or may have an in-line switch controlled by the host IC and login therein. In the latter case, the host IC controls the power supply to the DLPM, turning its state as either on or off. A common line 72 is a requirement of the DLPM and may be shared with the host IC common.

The power is conditioned through a voltage reference stage 74 for peak performance and fidelity of the DLPM sensing and analysis stages 78 and 84, respectively. A clock 76 provides a non-overlapping clock signal to control the switching mechanisms in the sense and analysis stages. The sense and analysis stages work together to examine the process induced parameter mismatch present in the IC.

The sense stage 78 includes pairs of test devices 80 (DEVICE A and DEVICE A'). The pairs of test devices DEVICE A and DEVICE A' are designed to be identical to the devices 31 used in the host IC design as shown in FIG. 2. The sense stage 78 may contain only one pair of test devices A-A' or multiple pairs B-B', C-C' etc. The different pairs may be different types of components or the same components with different geometries, e.g. W1/L1, W2/L2 W3/L3 W4/L4 where W and L are the applicable width and length, bias conditions, etc. The test pairs 80 may consist of transistor pairs, resistor pairs, capacitor pairs, inductor pairs, or any and all combinations that would be pertinent to realize useful parameter mismatch data relative to the host IC. The test pairs are suitably configured to produce a differential voltage as a function of the process parameter mismatch between the test devices.

The DLPM sense stage 78 sets biasing levels identically on both devices that make up the device pair DEVICE A and DEVICE A' and senses the differences between the two. Due to the fact that the sensing is performed on both of the devices in the pair simultaneously, the differences that arise from systematic and environmental variation apply to both devices and are not sensed (identical to systematic and environmental differences not being sensed in the host IC application). The mismatch sensing and analysis stage 84 is preferably shared between all of the pairs of devices, thereby further minimizing costly area on the IC. The analysis stage 84 amplifies and filters the mismatch and outputs a measure thereof for each pair 80. The analysis stage 84 suitably comprises a differential amplifier that amplifiers and filters a differential voltage produced across the pair of test devices on account of parameter mismatch.

To further reduce pad count, in turn, reducing valuable die area consumption, a circuit module referred to as a multiplexer 86 may be implemented into the DLPM, although not necessary for basic functionality. The Multiplexer or 'MUX', is a module that scans multiple inputs and outputs them through one output serially. Commonly the MUX will be included with the DLPM in order to reduce pad and pin count as shown in FIG. 4. The multiplexer outputs the values serially to a pin, pad 88 or alternatively to a feedback path in the host IC. A guard ring 90 may be located around the perimeter of the DLPM to separate the transfer of electrical noise between the DLPM and the host IC, maximizing sensitivity of the DLPM and minimizing the intrusiveness of incorporating the DLPM with the host IC circuit.

Figure 5:
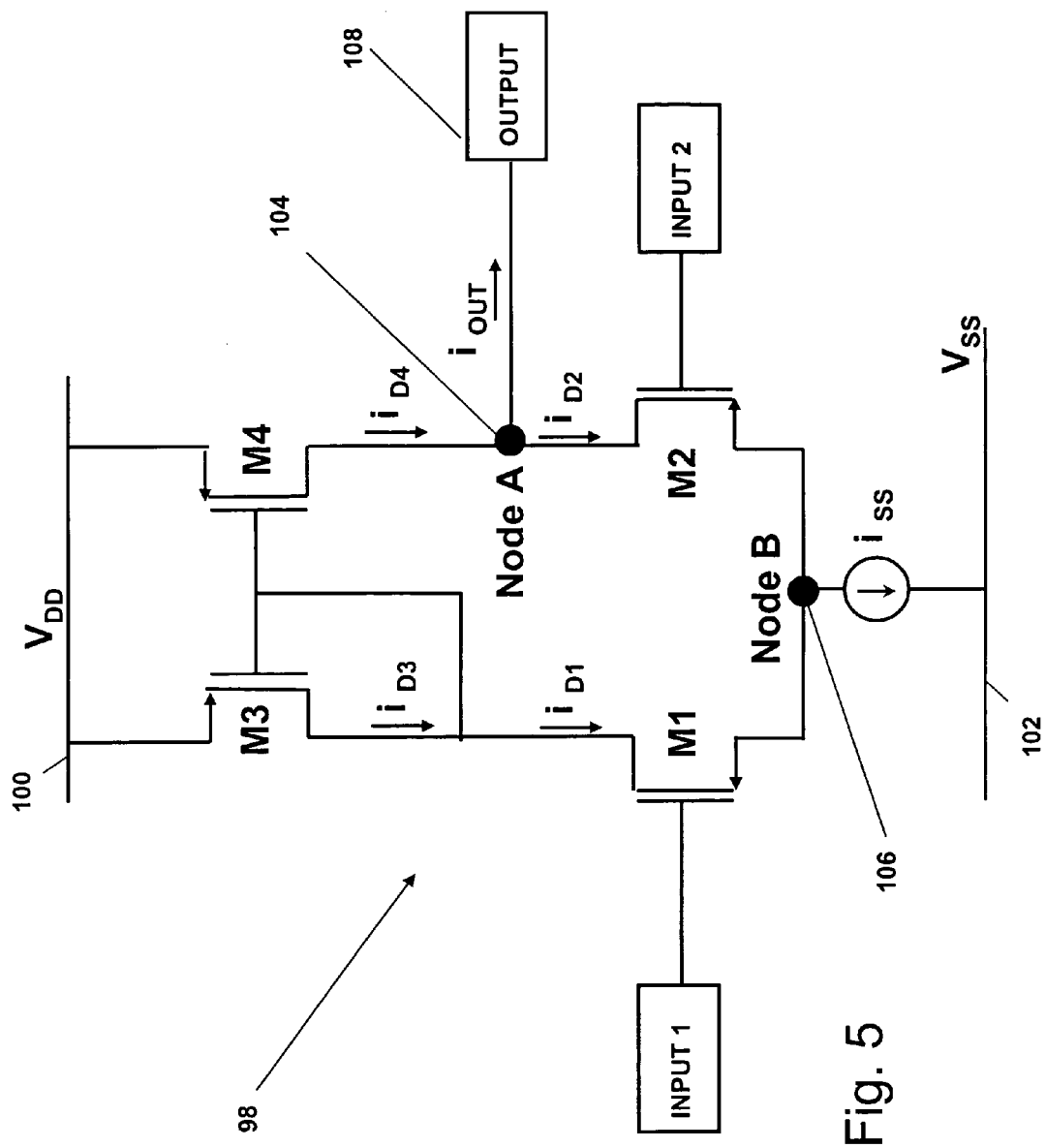
FIG. 5 is an embodiment of a DLPM core.

FIG. 5 shows the DLPM core circuit 98 in its most basic form incorporating a differential amplifier. The supply voltage $V_{DD}$ (100) is supplied by the voltage reference (74 from FIG. 4). The common $V_{SS}$ (102) is shared with the host IC. The DLPM differential amplifier is formed by MOS transistors M1, M2, M3 and M4. The differential amplifier circuit amplifies the difference between the voltages applied at INPUT 1 and INPUT 2. M1 and M2 are identically designed and form the input differential transistor pair. The differential amplifier functions as follows: If M1 and M2 are identical the current flowing through both transistors should be equal as long as the voltage at INPUT 1 is equal to the voltage at INPUT 2. Transistors M3 and M4 are also designed identically to each other and form the load for M1 and M2.

Kirchhoff's current law states that the current flowing into a node must equal the current flowing out of a node. The transistor M4 sources a current $i_{D4}$ to M2 that should be equal to the current $i_{D2}$ that M2 requires, causing the current $i_{OUT}$ to be zero according to Kirchhoff's current law applied at node A (104). The voltages applied to the inputs controls the current flow through the transistors. If the voltage at INPUT 1 is greater than the voltage at INPUT 2, then $i_{D1}$ increases with respect to $i_{D2}$ since $i_{SS}$ is a constant and since $i_{SS}$ is necessarily equal to $i_{D1}+i_{D2}$ (Kirchhoff's current law applied at node B(106)). This increase in $i_{D1}$ implies an increase in the current sourced from M3, referred to as $i_{D3}$. If $I_{D3}$ increases, $I_{D4}$ should necessarily increase because of the mirrored configuration. However, since $i_{D2}$ decreased when the voltage at INPUT 1 became greater than the voltage at INPUT2, the only way to establish equilibrium is for current $i_{OUT}$ ($i_{OUT}$ becomes positive) to flow through the OUPUT. Conversely, if the voltage at INPUT 2 is greater than the voltage at INPUT 1, $i_{OUT}$ flowing through the OUTPUT becomes negative. The amount of current flowing as $i_{OUT}$ is generally in proportion to the voltage difference between INPUT 1 and INPUT 2 (ignoring any mismatch in transistors M1 and M2). This is the method in which the differential amplifier outputs the differences between its two inputs. Thus, the DLPM core circuit 98 generates $i_{OUT}$ as the measure of the mismatch of the process parameter of interest.

Modern Foundries are pushing the limits in terms of the small geometries that can be manufactured, resulting in large mismatch values. Any mismatch in the input transistors M1 and M2 will show up at the output. In order to minimize mismatch, the DLPM uses uncommonly large geometry input devices M1 and M2, as well as load devices M3 and M4. This increases the accuracy and the precision of the DLPM core differential amplifier. In the host IC application, increasing the sizes of all of the devices is not practical or possible due to area constraints. For the host IC the designers decide how much mismatch is acceptable to meet their performance needs. Subsequently, the geometries of the input devices are designed accordingly, using the mismatch model data supplied in the PDK. If the PDK information is not accurate, as is often the case, then the IC will not function with the desired performance.

In application, the DLPM implements the differential amplifier in various configurations. For the DLPM threshold voltage mismatch measurement, the transistors M1 and M2 form the device test pair. They are identically designed to each other and to replicate identically a like transistor pair in the host IC. The input voltage applied at INPUT 1 is identical to the voltage at INPUT 2. Therefore, the differential amplifier amplifies only the differences that result from mismatches of the two identically designed input transistors M1 and M2. In this embodiment, the transistors M1 and M2 have the same small geometry as the host IC transistors while transistors M3 and M4 are uncommonly large to minimize influences on the output from a mismatch between the load devices. Also, in this case, $i_{OUT}$ is a measure of the threshold voltage mismatch between transistor M1 and M2, hence the threshold voltage mismatch between the like transistor pair in the host IC.

For the other realizations of the DLPM, such as the resistance, capacitance and inductance cells, these test devices are connected to the inputs of the DLPM differential amplifier core 98 in a fashion in which any difference between the two test devices in the process parameter of interest will be represented as associated differences in voltages at the INPUT1 and INPUT2. In these cases, $i_{OUT}$ is a measure of the mismatch in: resistance, capacitance, inductance, transconductance, gate oxide leakage current, etc. between the pair of test devices, hence the mismatch between the like device pair in the host IC. For these parameters, the core transistors M1, M2, M3 and M4 are uncommonly large, to reduce mismatch in the sensor to an absolute minimum. The differential amplifier is the core of the DLPM implemented to measure process-induced mismatches between the two identically designer test devices attached to INPUT 1 and INPUT 2. The mismatch is converted by the differential amplifier into a precise flow of positive or negative current at the output, which is subsequently fed into the analysis stage attached at the OUTPUT 108.

As shown in the embodiment in FIG. 5 above, the test devices were the same type of devices and identically designed to the production devices whose process parameters they are configured to test. However, in some cases it is not necessary that the test devices replicate the entire production device in order to sense the process parameter. Accordingly, the test device may replicate the minimal portion of the production device structure necessary to extract the pertinent mismatch data. For example, to measure process parameters related to gate oxide thickness and gate oxide leakage current for a pair 120 of identically designed MOS transistors 122a and 122b in the host IC as shown in FIG. 6a, only the portion (gate metal 124, oxide 126, semiconductor 128) of the MOS transistor forming the MOS capacitor 130 need be replicated as shown in FIG. 6b. The drain 132 and source 134 regions may be omitted. Accordingly, the pair 140 of test devices 142a and 142b are suitably MOS capacitors that include a gate metal 144, oxide 146 and semiconductor 148 that replicate the MOS capacitors 130 in the production devices. The test devices are connected so that any mismatch in gate oxide thickness or gate oxide leakage current creates a differential voltage at the input to the differential amplifier, and thus a non-zero output current. Replicating only the minimal structure required to measure the process parameters, further minimizes area consumption, pad count and reducing possible complexity that adds to the number of dependencies for the accuracy of the output data.

Figure 7:
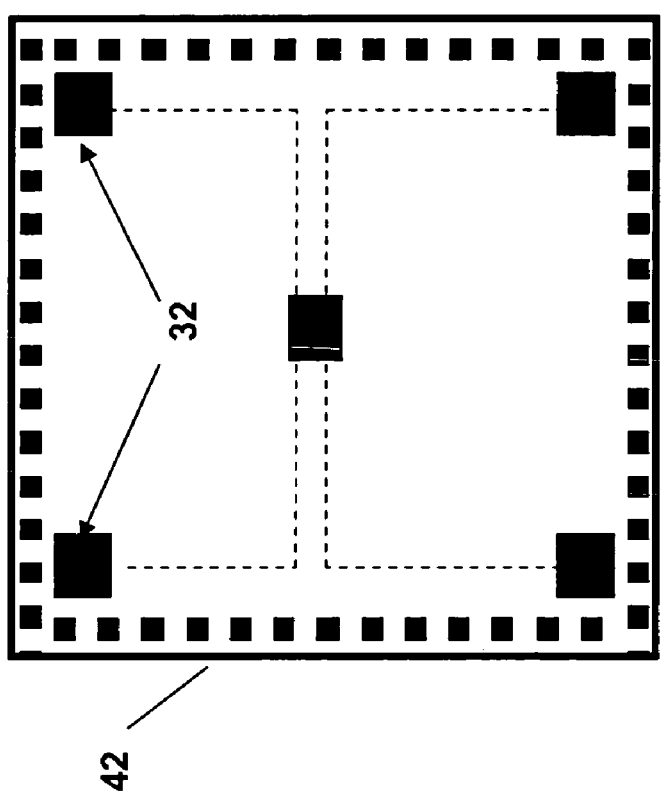
FIG. 7 is a diagram of an IC die having multiple DLPMs placed around the die for gather statistics on the process parameters.

In some production devices or, more likely, in order to independently characterize the foundry's process parameters or verify the IC design, it may be useful to place multiple DLPMs 32 on the die 42 as shown in FIG. 7. This approach provides feedback regarding process parameters at specific locations on a die and statistics on those parameters, which may assist both the foundry and the circuit designer. Typically, the DLPMs on a single die will be identical. Also, one of the DLPMs may be the 'master' to which all others provide their measures of the sensed parameters for on-chip analysis and readout through a single pad. Alternately, the measures from each DLPM could be multiplexed and readout for off-chip analysis.

Figure 8:
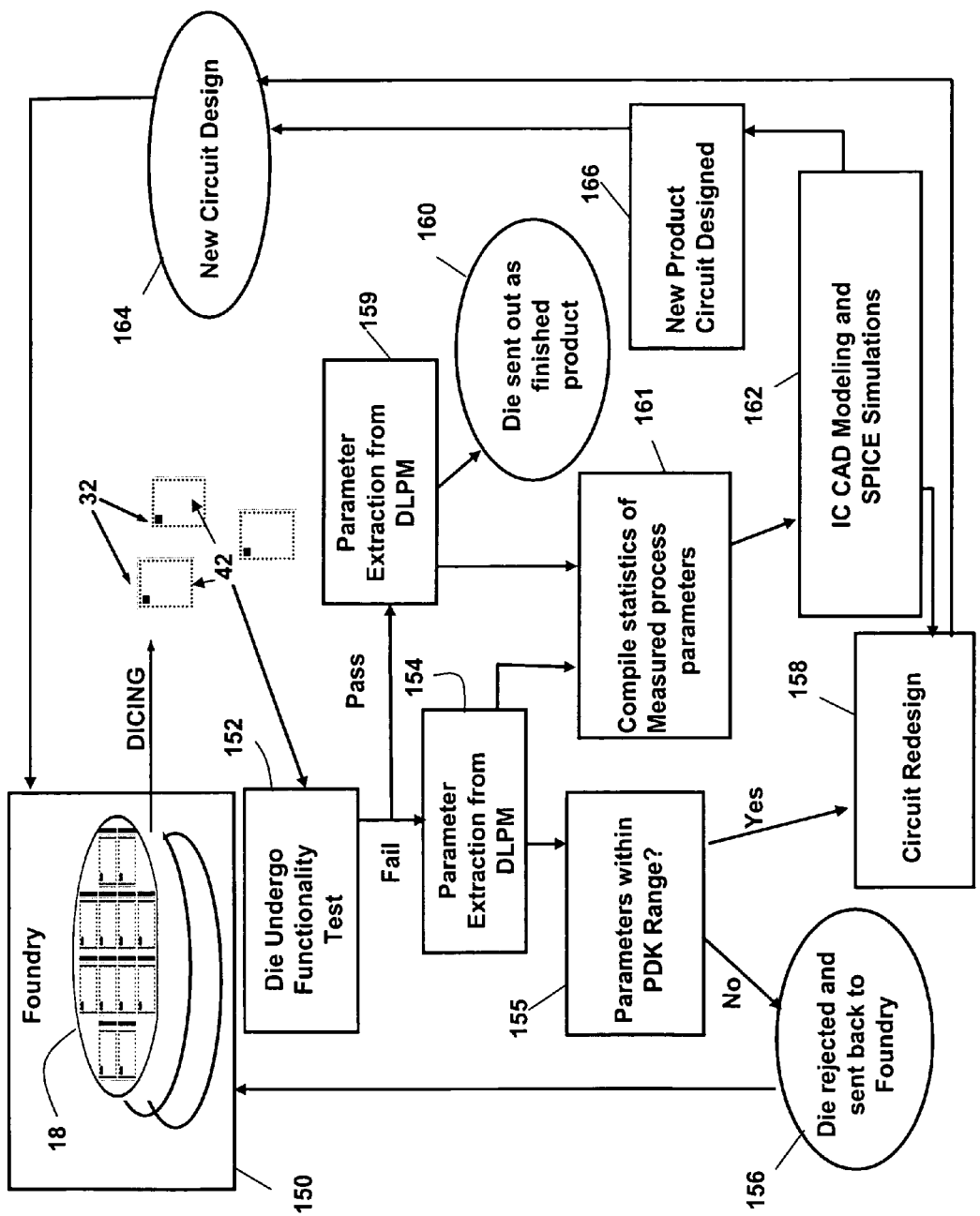
FIG. 8 is a flowchart illustrating a process by which a fabless company may use the DLPM to independently determine whether an IC malfunction is a result of the design or the manufacturing processing and to accumulate process parameter statistics.

The process by which the die 42 are manufactured and tested using the DLPM 32 to independently determining whether an IC malfunction is a result of the design or the manufacturing processing and to gather process parameter statistics to feedback to either the foundry or the IC designer is illustrated in FIG. 8. The processed wafers 18 from a foundry 150 are cut into die 42 including DLPM 32 and delivered to the customer, i.e. the fables company.

The fabless company checks the die to determine whether the output is within the acceptable range through a functionality electrical test 152. Conventionally, if the die function properly, they will be sent out as final product and if they fail (there are commonly at least 3% failures and may be up to 100% failures) the die are discarded without an accurate diagnosis of the root cause of the failure.

If the die fails the functionality test 152, with the DLPM 32 in place, the parameter mismatch measures are extracted and recorded 154 and compared PDK range specified by the foundry 155. If the mismatch values are not within the range specified by the manufacturer in the PDK then the root cause of the failure is readily apparent as a problem related to the quality control of the manufacturing process and the die can be returned to the foundry 156. If the die fails the functionality test 152, and the parameter mismatch value measured by the DLPM is within the spec of the manufacturer's PDK, then it is readily deducible that the design of the circuit is at fault and not the control of the manufacturing process or accuracy of PDK, and the IC must be re-designed 158.

If the die pass the functionality test, the process parameter mismatch may optionally be measured 159 to acquire data to refine the PDK models for a future circuit design using the same foundry and then the die will be sent out as acceptable product 160.

The process parameters from the die that pass and/or fail can be used to compile statistics 161. These statistics can be incorporated into the circuit design CAD modeling and SPICE simulations 162. This data will simulate the variations of the parameters to account for process variations, allowing the analysis and prediction of critical performance. A Monte-Carlo analysis with the incorporated mismatch values will allow the evaluation of the variation of circuit performance and subsequently allows prediction of yields. The DLPM mismatch data will facilitate the refinement of PDK models and subsequently, redefined circuit design margins in SPICE simulations 162, resulting in a new circuit design 164 (FIG. 3 file 56). The redesigned circuit design will thus be sent to the foundry 150 and manufactured with potentially improved performance and yield due to the DLPM data being taken advantage of during the re-design. The new refined PDK models with the incorporated DLPM sourced mismatch data may also be used for future new product circuit designs 166 that are to be manufactured at the same foundry using the same technology potentially resulting in improved performance and yield of the die on the first pass.

Up to this point, the DLPM has been used solely as a diagnostic tool to measure process parameter mismatch to either determine why an IC failed a functionality test or to gather data on the process parameters. Alternately, the DLPM may be used as part of a control circuit that functions to adjust the bias conditions of the IC in accordance with parameter mismatch. This may be useful to reduce the rejection rate of die that might not initially pass the functionality test or to compensate the IC as performance may change over time or operating conditions and environmental conditions.

Figure 9:
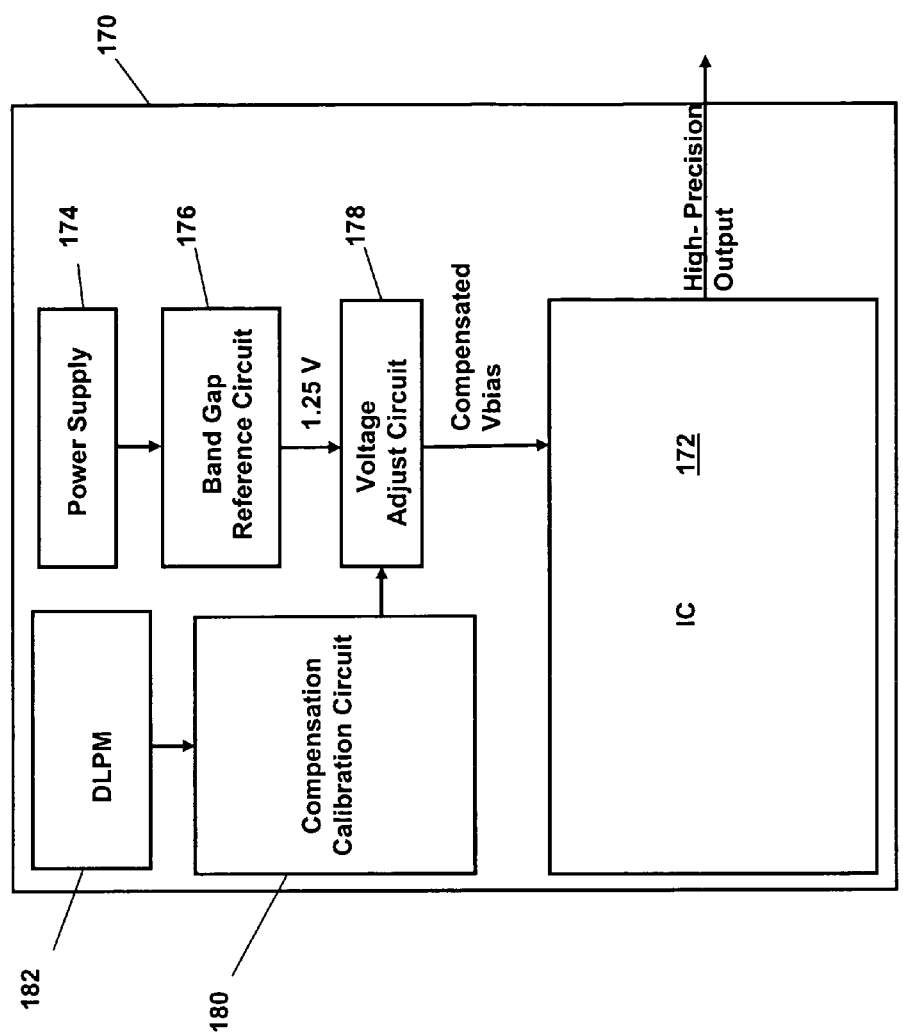
FIG. 9 is a block diagram of an IC die in which the DLPM provides feedback to the IC die to control bias conditions as a function of measured process parameters.

As shown in FIG. 9, a die 170 includes an IC 172 that is designed to operate for a specific voltage (Vbias). The voltage provided by a power supply 174 typically varies from application to application. Therefore a band gap reference circuit 176 is implemented that outputs ~1.25 volts independent of the power supply voltage. This voltage must then be stepped up or down depending on the Vbias voltage required by the IC to perform its functions accurately. For example the IC may be designed to run on 2.5 volts and the voltage adjust circuit 178 must step up the voltage from 1.25 to 2.5 Volts. The IC is designed to run off 2.5 Volts to output an extremely precise voltage.

If mismatches are present between devices in the IC, the IC may output a voltage higher or lower than the desired output voltage even though it has an input of 2.5 V. Accordingly, a compensation calibration circuit 180 reads out the measure(s) of the process parameter mismatch from a DLPM 182, and generates a control signal that is applied to the voltage adjustment circuit 178 to adjust the input voltage Vbias to calibrate out the error introduced in the IC by process-induced parameter mismatch. The calibration circuit may, for example, include a look-up table for particular IC that matches measured parameter mismatch to adjustments in the input voltage. The process variations are compensated for and the precision and accuracy of the IC is retained increasing the net yield of the chips accepted to be implemented in the field, improving their reliability in changing operating conditions or extending their lifetime.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A integrated circuit (IC) die, comprising:
   an IC on a die, said IC including a pair of production devices each characterized by at least one process parameter; and
   a die-level process monitor (DLPM) collocated with the IC on the die, said DLPM including a pair of test devices each characterized by said at least one process parameter, said pair of test devices configured to produce a differential electrical signal as a function of the process parameter mismatch between the test devices and including a differential amplifier that amplifies the differential electrical signal and outputs a single-ended electrical output signal as a measure of process variation between the pair of production devices in the IC.

2. The die of claim 1, wherein the production devices in said pair are identically designed and the test devices in said pair are identically designed.

3. The die of claim 2, wherein said test devices are the same type of devices as said production devices.

4. The die of claim 3, wherein said test device pair has an identical design to said production device pair.

5. The die of claim 2, wherein each said test device replicates a portion of the production device that exhibits the process parameter.

6. The die of claim 2, further comprising a plurality of DLPMs located at different locations on said die, each said DLPM generating a measure of the process parameter, one said DLPM configured to accumulate statistics of the variations of these measures output a statistical measure.

7. The die of claim 2, wherein the DLPM measures only one process parameter per test device pair.

8. The die of claim 2, wherein the IC comprises a plurality of production device pairs with different process parameters and/or geometries and said DLPM comprises a plurality of test device pairs that exhibit said different process parameters and/or geometries, each said pair of test devices configured to produce a differential electrical signal as a function of the process parameter mismatch between the test devices as a measure of process variation between the corresponding pair of production devices in the IC.

9. The die of claim 8, wherein said DLPM comprises a multiplexer that multiplexes the measures and serially outputs them to a single pad on the die.

10. The die of claim 1, wherein the DLPM shares power and a common with said IC.

11. The die of claim 1, wherein the die further comprises an input adapted to receive a control signal that turns the DLPM on and off.

12. The die of claim 11, wherein the input is an input pad to receive an externally applied control signal.

13. The die of claim 11, wherein the input receives an internal control signal from the IC.

14. The die of claim 1, further comprising a single output pad for said DLPM, said DLPM further comprising a plurality of test device pairs each configured to produce a differential electrical signal as a function of the process parameter mismatch between the test devices as a measure of process variation, a plurality of differential amplifiers that amplify the differential electrical signals and output single-ended electrical output signals, and a multiplexer that multiplexes the output signals and outputs them serially at said single pad.

15. The die of claim 14, wherein the DLPM shares power and a common with said IC.

16. The die of claim 14, wherein the die further comprises an input adapted to receive a control signal that turns the DLPM on and off.

17. The die of claim 1, further comprising an electrically insulating guard ring around the DLPM on the die.

18. The die of claim 1, further comprising:
A voltage reference circuit that supplies a bias voltage to the IC; and
A calibration circuit that adjusts the bias voltage based on the measure of the process parameter.

19. The IC die of claim 1, wherein said differential amplifier includes a pair of input transistors and wherein said test devices are said pair of input transistors.

20. The IC die of claim 1, wherein said at least one process parameter is selected from transistor threshold voltage, resistance, capacitance, inductance, transconductance and output conductance.

21. The IC die of claim 1, wherein said single-ended electrical output signal is a measure of variation in at least one of energy, temperature, pressure and concentration gradients, geometry or cleanliness of the IC manufacturing process.

22. The IC die of claim 1, wherein the DLPM outputs the measure of process variation without additional external circuitry.

23. An Integrated Circuit (IC) wafer, comprising:
A wafer having predetermined scribe lines defining an array of cells; and
A plurality of die arrayed on said wafer in said cells, each said die comprising,
an IC including a pair of production device each characterized by at least one process parameter; and
a die-level process monitor (DLPM) including a pair of test devices each characterized by said at least one process parameter, said pair of test devices configured to produce a differential electrical signal as a function of the process parameter mismatch between the test devices and including a differential amplifier that amplifies the differential electrical signal and outputs a single-ended electrical output signal as a measure of process variation between the pair of production devices in the IC.

24. The IC wafer of claim 23, further comprising test structures on the scribe lines of the wafer.

25. The IC wafer of claim 23, wherein the DLPMs vary across the wafer.

26. The die of claim 23, wherein the production devices in said pair are identically designed and the test devices in said pair are identically designed.

27. A integrated circuit (IC) die, comprising:
an IC on a die, said IC including production devices characterized by a process parameter; and
a die-level process monitor (DLPM) collocated with the IC on the die, said DLPM including a plurality of test devices configured to produce a differential electrical signal as a function of the mismatch between the test devices' process parameters and a differential amplifier that amplifies the differential electrical signal and outputs a single-ended electrical output signal as a measure of process variation between the production devices in said IC.

28. The IC die of claim 27, wherein said test devices are configured to produce the differential electrical signals as a function of the mismatch between one of the test devices' transistor threshold voltage, resistance, capacitance, inductance, transconductance and output conductance.

29. The IC die of claim 28, wherein said differential amplifier outputs the single-ended electrical output signal as a measure of variation in at least one of energy, temperature, pressure and concentration gradients, geometry or cleanliness of the IC manufacturing process.

* * * * *